United States Patent
Chow et al.

(10) Patent No.: US 8,685,792 B2
(45) Date of Patent: Apr. 1, 2014

(54) INTEGRATED CIRCUIT PACKAGE SYSTEM WITH INTERPOSER

(75) Inventors: Seng Guan Chow, Singapore (SG); Il Kwon Shim, Singapore (SG)

(73) Assignee: Stats Chippac Ltd., Singapore (SG)

( * ) Notice: Subject to any disclaimer, the term of this patent is extended or adjusted under 35 U.S.C. 154(b) by 187 days.

(21) Appl. No.: 12/040,558

(22) Filed: Feb. 29, 2008

(65) Prior Publication Data

US 2008/0211084 A1    Sep. 4, 2008

Related U.S. Application Data

(60) Provisional application No. 60/892,851, filed on Mar. 3, 2007.

(51) Int. Cl.
*H01L 23/498* (2006.01)

(52) U.S. Cl.
USPC ........... 438/109; 257/678; 257/686; 257/687; 257/723; 257/724; 257/E25.013

(58) Field of Classification Search
USPC ................. 257/702, 758, 723, 678, 724, 687, 257/E25.013, 686; 438/125, FOR. 368, 438/FOR. 426, 109
See application file for complete search history.

(56) References Cited

U.S. PATENT DOCUMENTS

| | | | |
|---|---|---|---|
| 6,504,241 B1 | 1/2003 | Yanagida | |
| 6,531,338 B2 | 3/2003 | Akram et al. | |
| 6,603,072 B1 | 8/2003 | Foster et al. | |
| 6,617,193 B1 | 9/2003 | Toshio et al. | |
| 6,621,155 B1 * | 9/2003 | Perino et al. | 257/686 |
| 6,713,860 B2 * | 3/2004 | Li | 257/700 |
| 6,861,288 B2 | 3/2005 | Shim et al. | |
| 7,049,692 B2 * | 5/2006 | Nishimura et al. | 257/686 |
| 7,141,874 B2 * | 11/2006 | Nakatani | 257/700 |
| 7,242,081 B1 * | 7/2007 | Lee | 257/686 |
| 7,288,835 B2 | 10/2007 | Yim et al. | |
| 7,309,913 B2 | 12/2007 | Shim et al. | |
| 7,364,945 B2 | 4/2008 | Shim et al. | |
| 7,372,141 B2 | 5/2008 | Karnezos et al. | |
| 7,429,787 B2 | 9/2008 | Karnezos et al. | |
| 7,795,727 B2 * | 9/2010 | Bauer et al. | 257/723 |
| 2004/0145039 A1 * | 7/2004 | Shim et al. | 257/678 |
| 2005/0218528 A1 * | 10/2005 | Beatty et al. | 257/778 |
| 2006/0220209 A1 * | 10/2006 | Karnezos et al. | 257/686 |
| 2007/0045796 A1 * | 3/2007 | Ye et al. | 257/678 |
| 2007/0210432 A1 * | 9/2007 | Cablao et al. | 257/686 |
| 2007/0278696 A1 | 12/2007 | Lu et al. | |

FOREIGN PATENT DOCUMENTS

JP    2002158312 A  *  5/2002

* cited by examiner

*Primary Examiner* — Alexander Sofocleous
*Assistant Examiner* — John P Dulka
(74) *Attorney, Agent, or Firm* — Ishimaru & Associates LLP

(57) ABSTRACT

An integrated circuit package system includes: providing a mountable integrated circuit system having an encapsulation with a cavity therein and a first interposer exposed by the cavity; mounting a second interposer over the first interposer for only stacking a discrete device thereover, and with the second interposer over the encapsulation and the cavity; and mounting an electrical component over the second interposer.

10 Claims, 6 Drawing Sheets

INTEGRATED CIRCUIT PACKAGE SYSTEM WITH INTERPOSER

CROSS-REFERENCE TO RELATED APPLICATION

This application claims the benefit of U.S. Provisional Patent Application Ser. No. 60/892,851 filed Mar. 3, 2007.

TECHNICAL FIELD

The present invention relates generally to an integrated circuit package system and more particularly to an integrated circuit package system with interposer.

BACKGROUND ART

Electronic devices such as smart phones, personal digital assistants, location based devices, digital cameras, music players, computers, or transportation, have become an integral part of many daily activities. Key components of these electronic devices are integrated circuit devices. These tiny integrated circuits must perform during daily activities including a wide variety of environmental conditions as well as potentially damaging forces. Many and varied types of packaging, intended for protection, interconnection or mounting, have been developed for integrated circuit devices.

Integrated circuit dies are conventionally enclosed in plastic packages that provide protection from hostile environments and enable electrical interconnection between the integrated circuit die and an underlying substrate such as a printed circuit board (PCB). The elements of such a package include: a lead frame or substrate, an integrated circuit die, bonding material to attach the integrated circuit die to the lead frame or substrate, bond wires or other connectors that electrically connect pads on the integrated circuit die to the lead frame or substrate. The package can also include a plastic or other insulating material that covers the components and forms the exterior of the package.

Wafer manufacturing strives to reduce transistor or capacitor feature size in order to increase circuit density and enhance functionality. Device geometries with sub-micron line widths are so common that individual chips routinely contain millions of electronic devices. Reduced feature size has been quite successful in improving electronic systems, and continuous development is expected in the future. However, significant obstacles to further reduction in feature size are being encountered. These obstacles include defect density control, optical system resolution limits, and availability of processing material and equipment. Attention has therefore increasingly shifted to semiconductor packaging as a means to fulfill the relentless demands for enhanced system performance.

Drawbacks of conventional designs include a relatively large footprint of the package on the mounting surface of motherboard. The footprint reflects dimensions that are typically the maximum of the package, namely, the maximum x-y dimensions of the package. In applications where mounting space is at a premium, such as pagers, portable telephones, and personal computers, among others, a large footprint is undesirable. With the goal of increasing the amount of circuitry in a package, but without increasing the area of the package so that the package does not take up any more space on the circuit board, manufacturers have been stacking two or more die within a single package. Unfortunately, sufficient overlap for electrical interconnect, large footprint top packages, increased device integration, pre-testing, and interconnect lengths have plagued previous package designs.

Thus, a need still remains for an integrated circuit package system to improve area and volume. In view of the ever-increasing commercial competitive pressures, along with growing consumer expectations and the diminishing opportunities for meaningful product differentiation in the marketplace, it is critical that answers be found for these problems. Additionally, the need to save costs, improve efficiencies and performance, and meet competitive pressures, adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

An integrated circuit package system includes: providing a mountable integrated circuit system having an encapsulation with a cavity therein and a first interposer exposed by the cavity; mounting a second interposer over the first interposer for only stacking a discrete device thereover, and with the second interposer over the encapsulation and the cavity; and mounting an electrical component over the second interposer.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
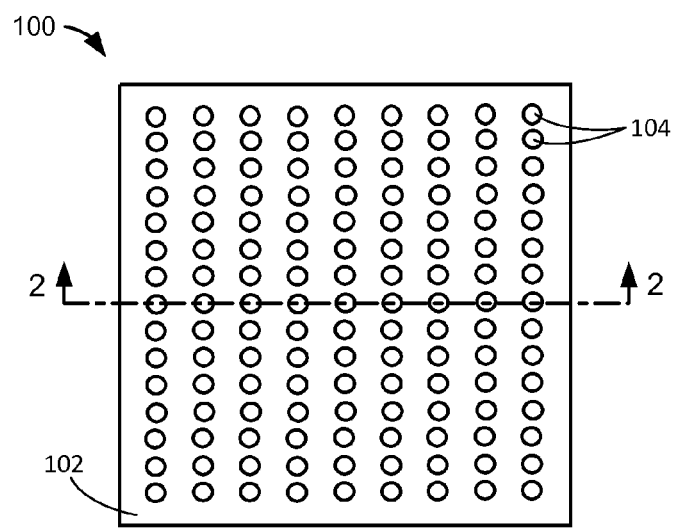
FIG. 1 is a bottom view of an integrated circuit package system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGs. Generally, the invention can be operated in any orientation.

In addition, where multiple embodiments are disclosed and described having some features in common, for clarity and ease of illustration, description, and comprehension thereof, similar and like features from one to another will ordinarily be described with like reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact among elements. The term "processing" as used herein includes deposition of material, patterning, exposure, development, etching, cleaning, molding, and/or removal of the material or as required in forming a described structure. The term "system" as used herein means and refers to the method and to the apparatus of the present invention in accordance with the context in which the term is used.

Referring now to FIG. 1, therein is shown a bottom view of an integrated circuit package system 100 in a first embodiment of the present invention. The bottom view depicts a base substrate 102, such as a laminated substrate, and external interconnects 104, such as solder balls, attached to the base substrate 102.

For illustrative purposes, the integrated circuit package system 100 is shown with the external interconnects 104 equally spaced. Although, it is understood that the integrated circuit package system 100 may have some sites depopulated such that the integrated circuit package system 100 may have the external interconnects 104 not equally spaced.

Figure 2:
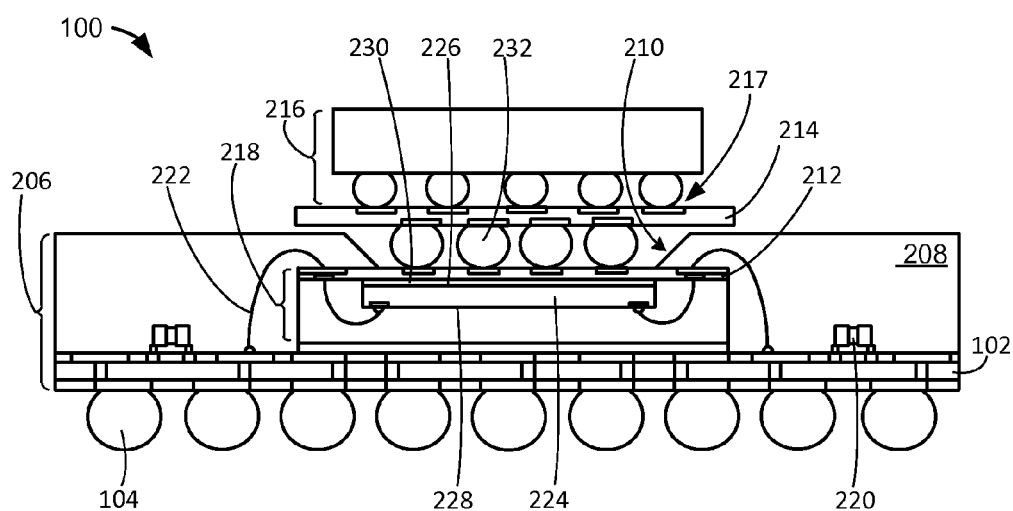
FIG. 2 is a cross-sectional view of the integrated circuit package system along line 2-2 of FIG. 1.

Referring now to FIG. 2, therein is shown a cross-sectional view of the integrated circuit package system 100 along line 2-2 of FIG. 1. The cross-sectional view depicts a mountable integrated circuit system 206 having an encapsulation 208, such as a cover comprising an epoxy molding compound, with a cavity 210 and having a first interposer 212 exposed by the cavity 210. A second interposer 214, such as a laminated substrate, mounts over the encapsulation 208 and the cavity 210. The second interposer 214 connects with the first interposer 212. An electronic component 216, such as a flip chip, is mounted over the second interposer 214. The second interposer 214, with the electronic component 216 thereover, is completely exposed from the encapsulation 208 or molding compound. An electrical attachment extent of the second interposer 214 includes a horizontal length greater than a horizontal length of an exposed extent of the first interposer 212. The electrical attachment extent is an area at a top side of the second interposer 214 for electrically attaching electrical components, including the electronic component 216, to the second interposer 214. The exposed extent is exposed from the encapsulation 208. The second interposer 214 has a side facing the cavity 210 and an opposite side having an electrical attachment area 217 directly over the cavity 210.

The mountable integrated circuit system 206, in this example, includes an integrated circuit package 218 and passive devices 220 over the base substrate 102, such as a laminated substrate. First internal interconnects 222, such as bond wires or ribbon bond wires, connect the first interposer 212 of the integrated circuit package 218 and the base substrate 102. The encapsulation 208 is over the base substrate 102 covering the integrated circuit package 218, the first internal interconnects 222, and the passive devices 220.

The integrated circuit package 218 includes an integrated circuit die 224. The integrated circuit die 224 includes a non-active side 226 and an active side 228, wherein the active side 228 includes active circuitry fabricated thereon. The non-active side 226 attaches with the first interposer 212 with an adhesive 230, such as a die-attach adhesive. The first internal interconnects 222, such as bond wires or ribbon bond wires, can connect the first interposer 212 of the integrated circuit package 218 and the base substrate 102. The external interconnects 104 can attach below and to the base substrate 102 for connection to the next system level (not shown), such as a printed circuit board or another integrated circuit package system.

The second interposer 214 includes electrical connectors 232, such as solder balls. As an example, the second interposer 214 connects with the first interposer 212 with the electrical connectors 232.

In this example, the electronic component 216 mounts over the second interposer 214. The electronic component may be a Known Good Device ("KGD") that has been functionally tested.

It has been discovered that the present invention provides an integrated circuit package on package system with reduced height by using the second interposer. The second interposer is configured to have redistribution layer and vias for bridging electrical connections between the integrated circuit below the second interposer and the electronic component above the second interposer.

It has also been discovered that in the present invention, the second interposer can be pre-attached to either the integrated circuit system or the electronic component in order to have them tested before final assembly. This feature can further reduce manufacturing cost and increase reliability.

Figure 3:
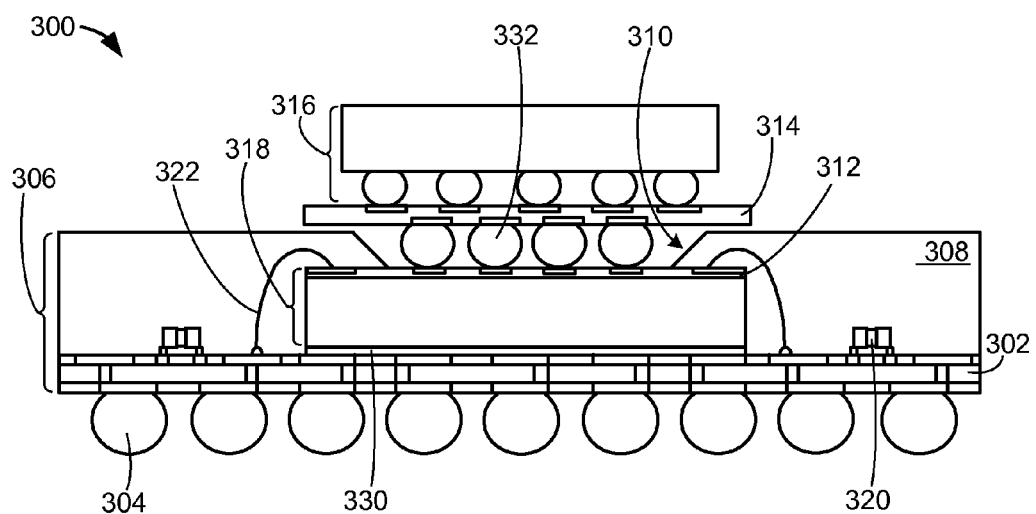
FIG. 3 is a cross-sectional view of an integrated circuit package system exemplified by the bottom view of FIG. 1 along line 2-2 of FIG. 1 in a second embodiment of the present invention.

Referring now to FIG. 3, therein is shown a cross-sectional view of an integrated circuit package system 300 along line 2-2 of FIG. 1 in a second embodiment of the present invention. The cross-sectional view depicts a mountable integrated circuit system 306 having an encapsulation 308, such as a cover comprising an epoxy molding compound, with a cavity 310 and having a first interposer 312 exposed by the cavity 310. A second interposer 314, such as a laminated substrate, mounts over the encapsulation 308 and the cavity 310. The second interposer 314 connects with the first interposer 312. An electronic component 316, such as a flip chip, is mounted over the second interposer 314.

The mountable integrated circuit system 306, in this example, includes an integrated circuit package 318 and passive devices 320 over a base substrate 302, such as a laminated substrate. First internal interconnects 322, such as bond wires or ribbon bond wires, connect the first interposer 312 of the integrated circuit package 318 and the base substrate 302. The encapsulation 308 is over the base substrate 302 covering the integrated circuit package 318, the first internal interconnects 322, and the passive devices 320.

For example, the integrated circuit package 318 can be a Wafer Level Chip Scale Package (WLCSP), a Redistributed Layer (RDL) die or a flip chip. The integrated circuit package 318 includes the first interposer 312. The integrated circuit package 318 attaches to the base substrate 302 with an adhesive 330, such as a die-attach adhesive. The first internal interconnects 322, such as bond wires or ribbon bond wires, can connect the first interposer 312 and the base substrate 302. External interconnects 304 can attach below and to the base substrate 302 for connection to the next system level (not shown), such as a printed circuit board or another integrated circuit package system.

The second interposer 314 includes electrical connectors 332, such as solder balls. As an example, the second interposer 314 connects with the first interposer 312 with the electrical connectors 332.

In this example, the electronic component 316 mounts over the second interposer 314. The electronic component may be a Known Good Device ("KGD") that has been functionally tested.

Figure 4:
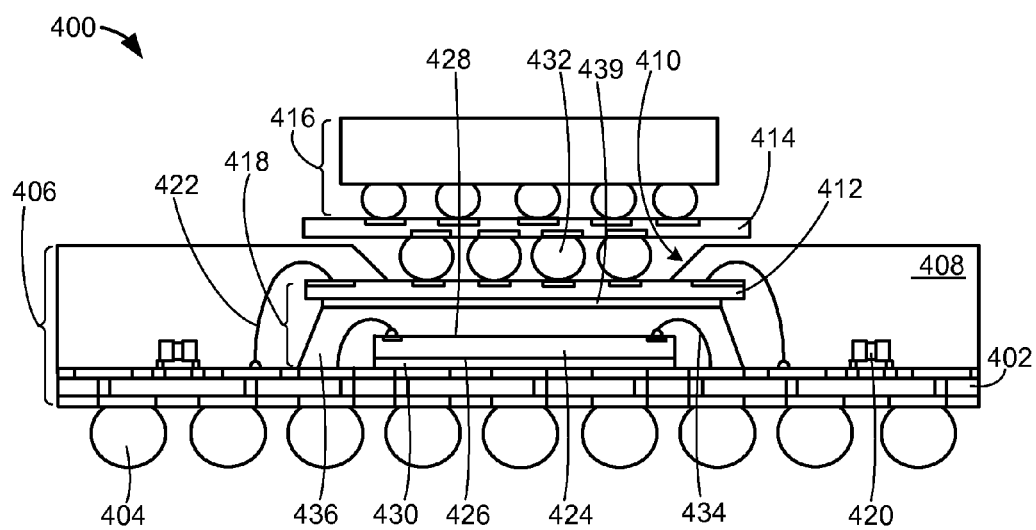
FIG. 4 is a cross-sectional view of an integrated circuit package system exemplified by the bottom view of FIG. 1 along line 2-2 of FIG. 1 in a third embodiment of the present invention.

Referring now to FIG. 4, therein is shown a cross-sectional view of an integrated circuit package system 400 along line 2-2 of FIG. 1 in a third embodiment of the present invention. The cross-sectional view depicts a mountable integrated circuit system 406 having an encapsulation 408, such as a cover comprising an epoxy molding compound, with a cavity 410 and having a first interposer 412 exposed by the cavity 410. A second interposer 414, such as a laminated substrate, mounts over the encapsulation 408 and the cavity 410. The second interposer 414 connects with the first interposer 412. An electronic component 416, such as a flip chip, is mounted over the second interposer 414.

The mountable integrated circuit system 406, in this example, includes an integrated circuit package 418 and passive devices 420 over a base substrate 402, such as a laminated substrate. First internal interconnects 422, such as bond wires or ribbon bond wires, connect the first interposer 412 of the integrated circuit package 418 and the base substrate 402. The encapsulation 408 is over the base substrate 402 covering the integrated circuit package 418, the first internal interconnects 422, and the passive devices 420.

The integrated circuit package 418 includes an integrated circuit die 424. The integrated circuit die 424 includes a non-active side 426 and an active side 428, wherein the active side 428 includes active circuitry fabricated thereon. The non-active side 426 attaches with the base substrate 402 with an adhesive 430, such as a die-attach adhesive. Second internal interconnects 434, such as bond wires or ribbon bond wires, can connect the active side 428 and the base substrate 402. An inner encapsulation 436, such as a cover comprising an epoxy molding compound, is over the base substrate 402 covering the integrated circuit die 424 and the second internal interconnects 434.

The first interposer 412 mounts over the inner encapsulation 436 of the integrated circuit package 418 with a second adhesive 439. The second interposer 414 includes electrical connectors 432, such as solder balls. As an example, the second interposer 414 connects with the first interposer 412 with the electrical connectors 432. In this example, the electronic component 416 mounts over the second interposer 414. External interconnects 404 can attach below and to the base substrate 402 for connection to the next system level (not shown), such as a printed circuit board or another integrated circuit package system.

Figure 5:
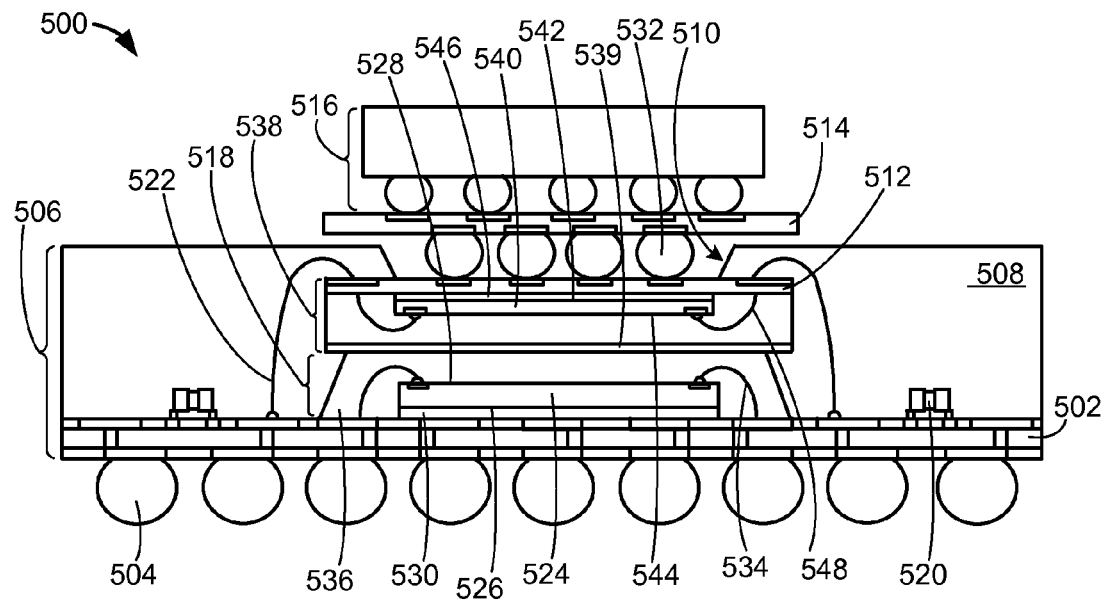
FIG. 5 is a cross-sectional view of an integrated circuit package system exemplified by the bottom view of FIG. 1 along line 2-2 of FIG. 1 in a fourth embodiment of the present invention.

Referring now to FIG. 5, therein is shown a cross-sectional view of an integrated circuit package system 500 along line 2-2 of FIG. 1 in a fourth embodiment of the present invention. The cross-sectional view depicts a mountable integrated circuit system 506 having an encapsulation 508, such as a cover comprising an epoxy molding compound, with a cavity 510 and having a first interposer 512 exposed by the cavity 510. A second interposer 514, such as a laminated substrate, mounts over the encapsulation 508 and the cavity 510. The second interposer 514 connects with the first interposer 512. An electronic component 516, such as a flip chip, is mounted over the second interposer 514.

The mountable integrated circuit system 506, in this example, includes a first integrated circuit package 518, a second integrated circuit package 538, and passive devices 520 over a base substrate 502, such as a laminated substrate. The second integrated circuit package 538 is over the first integrated circuit package 518.

First internal interconnects 522, such as bond wires or ribbon bond wires, connect the first interposer 512 of the second integrated circuit package 538 and the base substrate 502. The encapsulation 508 is over the base substrate 502 covering the first integrated circuit package 518, the second integrated circuit package 538, the first internal interconnects 522, and the passive devices 520.

The first integrated circuit package 518 includes an integrated circuit die 524. The integrated circuit die 524 includes a first non-active side 526 and a first active side 528, wherein the first active side 528 includes active circuitry fabricated thereon. The first non-active side 526 attaches to the base substrate 502 with a first adhesive 530, such as a die-attach adhesive. Second internal interconnects 534, such as bond wires or ribbon bond wires, can connect the first active side 528 and the base substrate 502. An inner encapsulation 536, such as a cover comprising an epoxy molding compound, is over the base substrate 502 covering the integrated circuit die 524 and the second internal interconnects 534.

The second integrated circuit package 538 mounts over the first integrated circuit package 518 with a second adhesive 539. The second integrated circuit package 538 includes a second integrated circuit die 540. The second integrated circuit die 540 includes a second non-active side 542 and a second active side 544 wherein the second active side 544 includes active circuitry fabricated thereon. The second non-active side 542 attaches with the first interposer 512 with a third adhesive 546. The second active side 544 can connect with the first interposer 512 with third internal interconnects 548.

The second interposer 514 includes electrical connectors 532, such as solder balls. As an example, the second interposer 514 connects with the first interposer 512 with the electrical connectors 532. External interconnects 504 can attach below and to the base substrate 502 for connection to the next system level (not shown), such as a printed circuit board or another integrated circuit package system.

Figure 6:
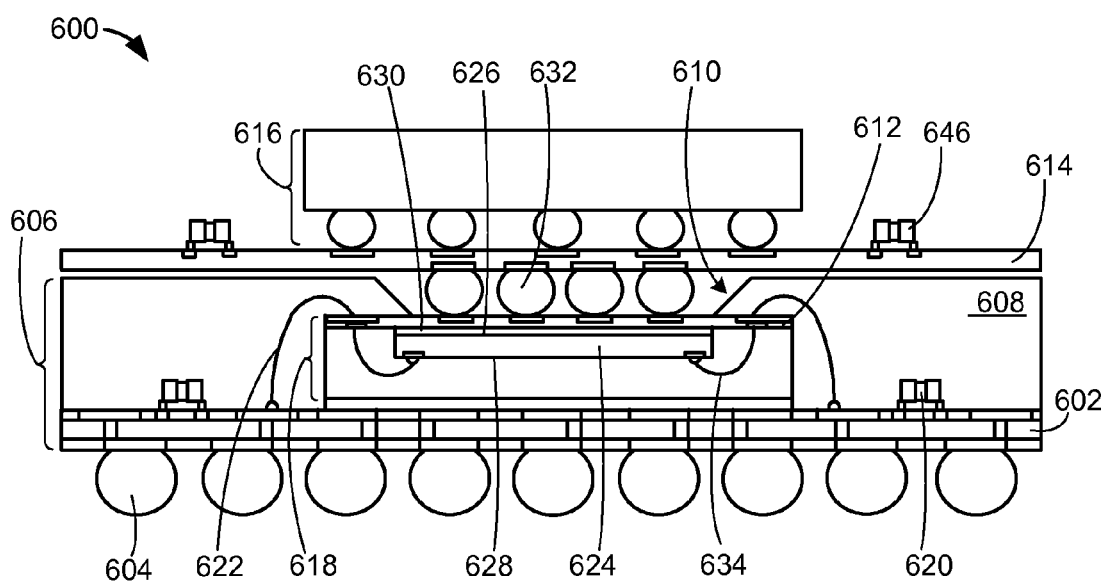
FIG. 6 is a cross-sectional view of an integrated circuit package system exemplified by the bottom view of FIG. 1 along line 2-2 of FIG. 1 in a fifth embodiment of the present invention.

Referring now to FIG. 6, therein is shown a cross-sectional view of an integrated circuit package system 600 along line 2-2 of FIG. 1 in a fifth embodiment of the present invention. The cross-sectional view depicts a mountable integrated circuit system 606 having an encapsulation 608, such as a cover comprising an epoxy molding compound, with a cavity 610 and having a first interposer 612 exposed by the cavity 610. A second interposer 614, such as a laminated substrate, mounts over the encapsulation 608 and the cavity 610. The second interposer 614 connects with the first interposer 612. An electronic component 616, such as a flip chip or a packaged integrated circuit device, is mounted over the second interposer 614.

For illustrative purposes, the integrated circuit package system 600 is shown with the electronic component as a single device, although it is understood that the integrated circuit package system 600 may have electronic components over the second interposer 614 in a different configuration. For example, the electronic component 616 may represent a number of components.

The mountable integrated circuit system 606, in this example, includes an integrated circuit package 618 and passive devices 620 over a base substrate 602, such as a laminated substrate. First internal interconnects 622, such as bond wires or ribbon bond wires, connect the first interposer 612 of the integrated circuit package 618 and the base substrate 602.

The encapsulation 608 is over the base substrate 602 covering the integrated circuit package 618, the first internal interconnects 622, and the passive devices 620. For illustrative purposes, the integrated circuit package system 600 is shown with the encapsulation 608 having vertical sidewalls over the top side of the base substrate 602, although it is understood that the integrated circuit package system 600 may have a different configuration for the encapsulation 608. For example, the encapsulation 608 can partially cover the top side of the base substrate 602 with non-vertical sidewalls.

The integrated circuit package 618 includes an integrated circuit die 624. The integrated circuit die 624 includes a non-active side 626 and an active side 628, wherein the active side 628 includes active circuitry fabricated thereon. The non-active side 626 attaches with the first interposer 612 with an adhesive 630, such as a die-attach adhesive. Second internal interconnects 634, such as bond wires or ribbon bond wires, can connect the active side 628 and the base substrate 602. External interconnects 604 can attach below and to the base substrate 602 for connection to the next system level (not shown), such as a printed circuit board or another integrated circuit package system.

The second interposer 614 includes electrical connectors 632, such as solder balls. For example, the second interposer 614 connects with the first interposer 612 with the electrical connectors 632. Also for example, the second interposer 614 extends the length of a top side of the encapsulation 608 and further passive devices 646 mount over or directly on the second interposer 614.

Figure 7:
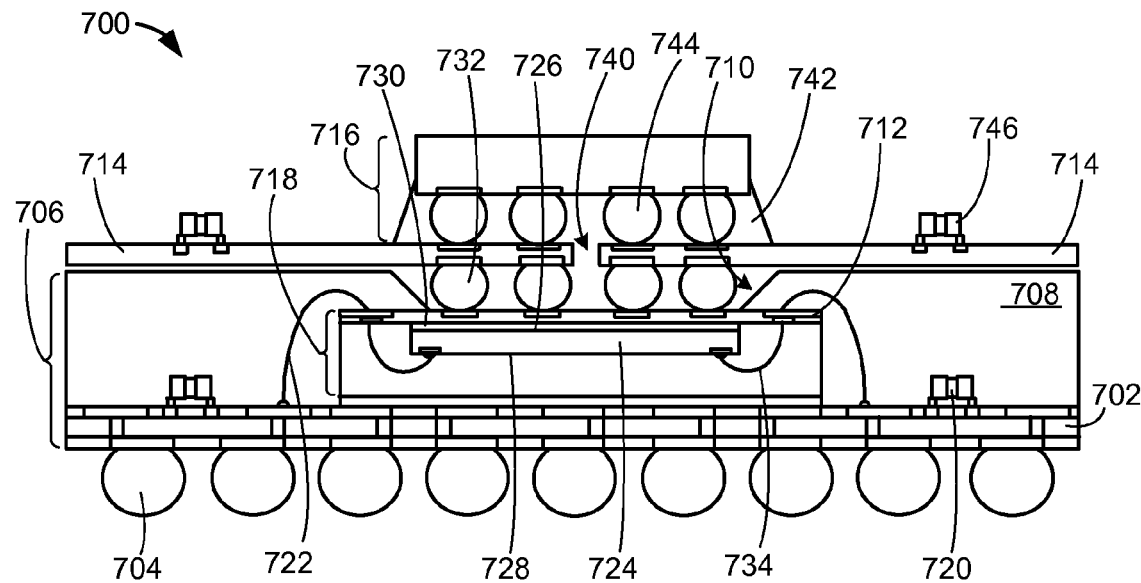
FIG. 7 is a cross-sectional view of an integrated circuit package system exemplified by the bottom view of FIG. 1 along line 2-2 of FIG. 1 in a sixth embodiment of the present invention.

Referring now to FIG. 7, therein is shown a cross-sectional view of an integrated circuit package system 700 along line 2-2 of FIG. 1 in a sixth embodiment of the present invention. The cross-sectional view depicts a mountable integrated circuit system 706 having an encapsulation 708, such as a cover comprising an epoxy molding compound, with a cavity 710 and having a first interposer 712 exposed by the cavity 710. A second interposer 714, such as a laminated substrate, mounts over the encapsulation 708 and the cavity 710. The second interposer 714 includes a slot 740 over the cavity 710. The second interposer 714 connects with the first interposer 712. An electronic component 716, such as a packaged integrated circuit device, is mounted over the second interposer 714.

The mountable integrated circuit system 706, in this example, includes an integrated circuit package 718 and passive devices 720 over a base substrate 702, such as a laminated substrate. First internal interconnects 722, such as bond wires or ribbon bond wires, connect the first interposer 712 of the integrated circuit package 718 and the base substrate 702. The encapsulation 708 is over the base substrate 702 covering the integrated circuit package 718, the first internal interconnects 722, and the passive devices 720.

The integrated circuit package 718 includes an integrated circuit die 724. The integrated circuit die 724 includes a non-active side 726 and an active side 728, wherein the active side 728 includes active circuitry fabricated thereon. The non-active side 726 attaches with the first interposer 712 with an adhesive 730, such as a die-attach adhesive. Second internal interconnects 734, such as bond wires or ribbon bond wires, can connect the active side 728 and the first interposer 712. External interconnects 704 can attach below and to the base substrate 702 for connection to the next system level (not shown), such as a printed circuit board or another integrated circuit package system.

The second interposer 714 includes electrical connectors 732, such as solder balls. As an example, the second interposer 714 connects with the first interposer 712 with the electrical connectors 732. An underfill 742 surrounds the electrical connectors 732, fills the cavity 710, and surrounds component connectors 744 of the electronic component 716. The underfill 742 also fills the slot 740. The slot 740 can be used for flow of the underfill 742. Further passive devices 746 also mount over the second interposer 714.

Figure 8:
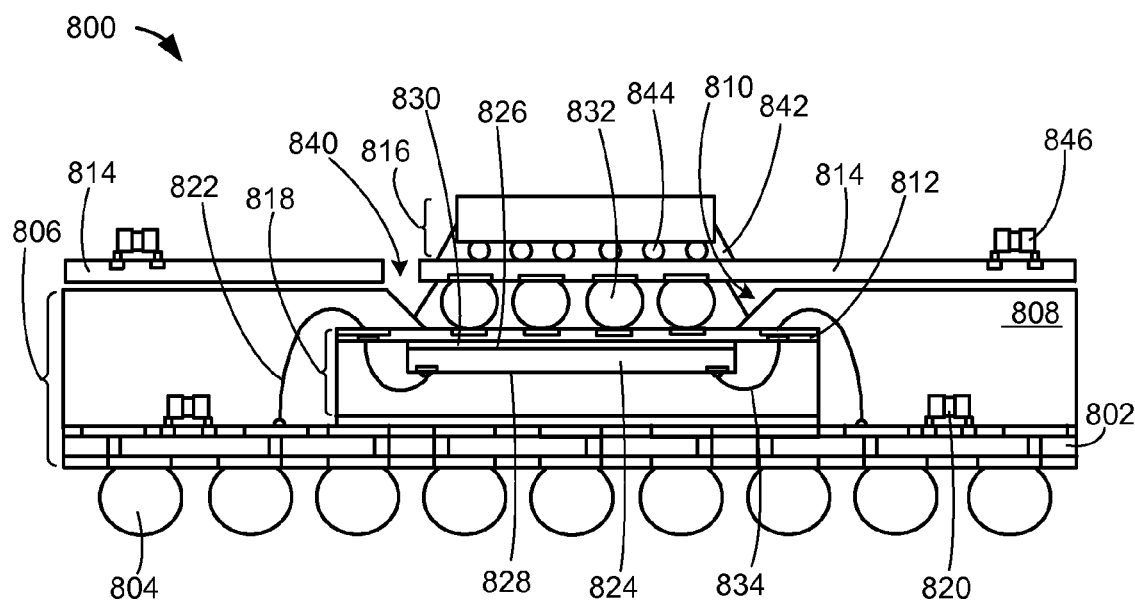
FIG. 8 is a cross-sectional view of an integrated circuit package system exemplified by the bottom view of FIG. 1 along line 2-2 of FIG. 1 in a seventh embodiment of the present invention.

Referring now to FIG. 8, therein is shown a cross-sectional view of an integrated circuit package system 800 along line 2-2 of FIG. 1 in a seventh embodiment of the present invention. The cross-sectional view depicts a mountable integrated circuit system 806 having an encapsulation 808, such as a cover comprising an epoxy molding compound, with a cavity 810 and having a first interposer 812 exposed by the cavity 810. A second interposer 814, such as a laminated substrate, mounts over the encapsulation 808 and the cavity 810. The second interposer 814 includes a slot 840 over the cavity 810 and along a side wall of the cavity 810. The second interposer 814 connects with the first interposer 812. An electronic component 816, such as a flip chip, is mounted over the second interposer 814.

The mountable integrated circuit system 806, in this example, includes an integrated circuit package 818 and passive devices 820 over a base substrate 802, such as a laminated substrate. First internal interconnects 822, such as bond wires or ribbon bond wires, connect the first interposer 812 of the integrated circuit package 818 and the base substrate 802. The encapsulation 808 is over the base substrate 802 covering the integrated circuit package 818, the first internal interconnects 822, and the passive devices 820.

The integrated circuit package 818 includes an integrated circuit die 824. The integrated circuit die 824 includes a non-active side 826 and an active side 828, wherein the active side 828 includes active circuitry fabricated thereon. The non-active side 826 attaches with the first interposer 812 with an adhesive 830, such as a die-attach adhesive. Second internal interconnects 834, such as bond wires or ribbon bond wires, can connect the active side 828 and the first interposer 812. External interconnects 804 can attach below and to the base substrate 802 for connection to the next system level (not shown), such as a printed circuit board or another integrated circuit package system.

The second interposer 814 includes electrical connectors 832, such as solder balls. As an example, the second interposer 814 connects with the first interposer 812 with the electrical connectors 832. An underfill 842 surrounds the electrical connectors 832, fills the cavity 810, and surrounds component connectors 844 of the electronic component 816. The underfill 842 includes low viscosity material such that it cannot be used as an encapsulation, such as the encapsulation 808. The slot 840 can be used for flow of the underfill 842. Further passive devices 846 also mount over the second interposer 814.

Figure 9:
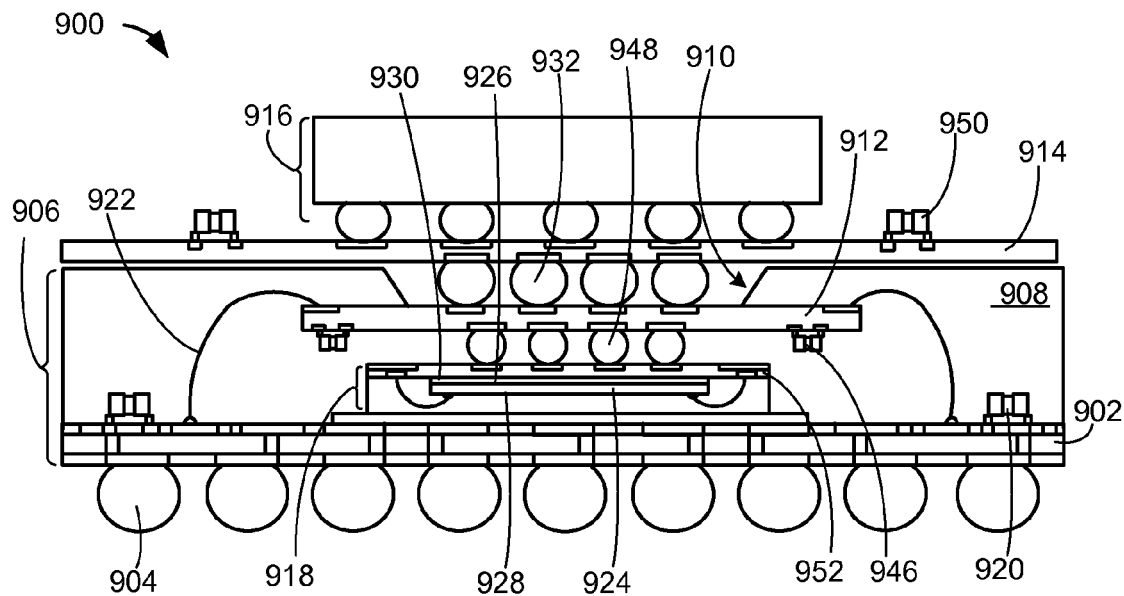
FIG. 9 is a cross-sectional view of an integrated circuit package system exemplified by the bottom view of FIG. 1 along line 2-2 of FIG. 1 in a eighth embodiment of the present invention.

Referring now to FIG. 9, therein is shown a cross-sectional view of an integrated circuit package system 900 along line 2-2 of FIG. 1 in an eighth embodiment of the present invention. The cross-sectional view depicts a mountable integrated circuit system 906 having an encapsulation 908, such as a cover comprising an epoxy molding compound, with a cavity 910 and having a first interposer 912 exposed by the cavity 910. A second interposer 914, such as a laminated substrate, mounts over the encapsulation 908 and the cavity 910. The second interposer 914 connects with the first interposer 912. An electronic component 916, such as a flip chip, is mounted over the second interposer 914.

The mountable integrated circuit system 906, in this example, includes an integrated circuit package 918 and passive devices 920 over a base substrate 902, such as a laminated substrate. First internal interconnects 922, such as bond wires or ribbon bond wires, connect the first interposer 912 of the integrated circuit package 918 and the base substrate 902.

The integrated circuit package 918 includes an integrated circuit die 924. The integrated circuit die 924 includes a non-active side 926 and an active side 928, wherein the active side 928 includes active circuitry fabricated thereon. The non-active side 926 attaches with a carrier 952, such as a laminated substrate, with an adhesive 930, such as a die-attach adhesive.

The first interposer 912, such as a laminated substrate, mounts over the integrated circuit package 918 and connects with the integrated circuit package 918 with internal connectors 948, such as solder balls. Further passive devices 946 also mount to and below the first interposer 912.

The second interposer 914 includes electrical connectors 932, such as solder balls. As an example, the second interposer 914 connects with the first interposer 912 with the electrical connectors 932. The second interposer 914 can extend the length of a top side of the encapsulation 908. Yet further passive devices 950 mounts over the second interposer 914.

The encapsulation 908 is over the base substrate 902 covering the integrated circuit package 918, the first internal interconnects 922, the passive devices 920, and the further passive devices 946. External interconnects 904 can attach below and to the base substrate 902 for connection to the next system level (not shown), such as a printed circuit board or another integrated circuit package system.

Figure 10:
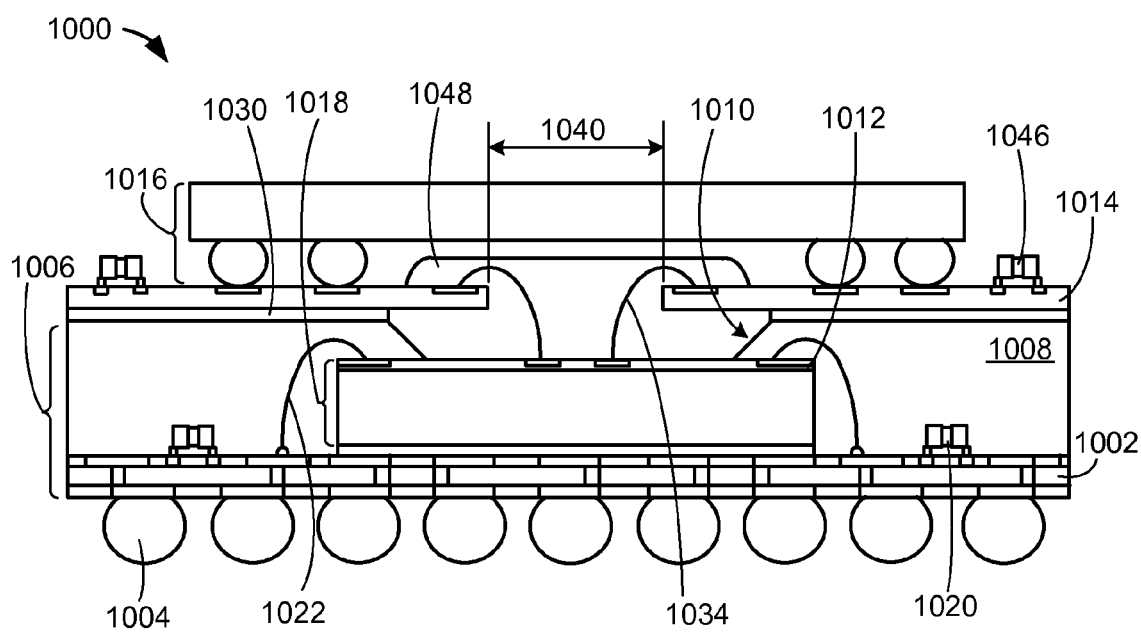
FIG. 10 is a cross-sectional view of an integrated circuit package system exemplified by the bottom view of FIG. 1 along line 2-2 of FIG. 1 in a ninth embodiment of the present invention.

Referring now to FIG. 10, therein is shown a cross-sectional view of an integrated circuit package system 1000 along line 2-2 of FIG. 1 in a ninth embodiment of the present invention. The cross-sectional view depicts a mountable integrated circuit system 1006 having an encapsulation 1008, such as a cover comprising an epoxy molding compound, with a cavity 1010 and having a first interposer 1012 exposed by the cavity 1010.

A second interposer 1014, such as a laminated substrate, mounts over the encapsulation 1008 with an adhesive 1030 and over the cavity 1010. The second interposer 1014 includes a slot 1040 over the cavity 1010. An electronic component 1016, such as a packaged integrated circuit device, is mounted over the second interposer 1014.

The mountable integrated circuit system 1006, in this example, includes an integrated circuit package 1018 and passive devices 1020 over a base substrate 1002, such as a laminated substrate. First internal interconnects 1022, such as bond wires or ribbon bond wires, connect the first interposer 1012 of the integrated circuit package 1018 and the base substrate 1002. Second internal interconnects 1034, through the slot 1040, connect the center bond pads of the first interposer 1012 and the second interposer 1014. The encapsulation 1008, such as cover comprising an epoxy molding compound, is over the base substrate 1002 covering the integrated circuit package 1018, the first internal interconnects 1022, and the passive devices 1020. A cavity cover 1048, such as a cover comprising a glob top material, fills the slot 1040 and the cavity 1010 covering the second internal interconnects 1034.

Further passive devices 1046 also mount over the second interposer 1014. External interconnects 1004 can attach below and to the base substrate 1002 for connection to the next system level (not shown), such as a printed circuit board or another integrated circuit package system.

Figure 11:
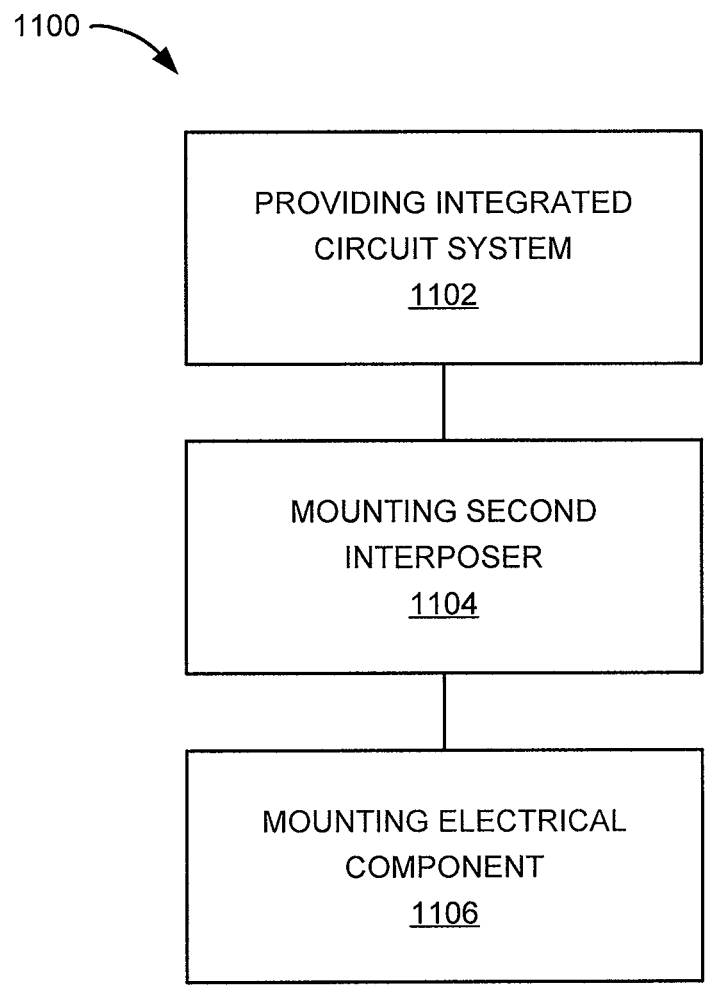
FIG. 11 is a flow chart of an integrated circuit package system for manufacturing of the integrated circuit package system in an embodiment of the present invention.

Referring now to FIG. 11, therein is shown a flow chart of an integrated circuit package system 1100 for manufacturing of the integrated circuit package system 100 in an embodiment of the present invention. The system 1100 includes providing a mountable integrated circuit system having an encapsulation with a cavity therein and a first interposer exposed by the cavity in a block 1102; mounting a second interposer over the first interposer for only stacking a discrete device thereover, and with the second interposer over the encapsulation and the cavity in a block 1104; and mounting an electrical component over the second interposer in a block 1106.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the integrated circuit package system of the present invention furnishes important and heretofore unknown and unavailable solutions, capabilities, and functional aspects for improving yield, increasing reliability, and reducing cost of circuit system. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit package system comprising:

providing a mountable integrated circuit system having an encapsulation with a cavity, a passive device, and a first interposer therein, the first interposer exposed by the cavity, the cavity having a cavity width;

mounting a second interposer over the first interposer and the encapsulation, the second interposer having a side facing the cavity and an opposite side having an electrical attachment area directly over the cavity, the second interposer having an interposer width greater than the cavity width;

mounting an electrical component over the second interposer via electrical connectors, the electrical component completely exposed from the encapsulation, the electrical component having an electrical component width greater than the cavity width, wherein the electrical component and the electrical connectors are capable of being readily detachable from the second interposer for functional testing; and mounting a further passive device directly on the second interposer.

2. The method as claimed in claim 1 further comprising attaching the second interposer over the encapsulation and the cavity with an adhesive.

3. The method as claimed in claim 1 wherein mounting the second interposer includes mounting the second interposer having a hole over the cavity.

4. The method as claimed in claim 1 further comprising applying an underfill through a hole of the second interposer.

5. The method as claimed in claim 1 wherein mounting the second interposer over the first interposer includes connecting the second interposer with the first interposer.

6. A method of manufacture of an integrated circuit package system comprising:

providing a mountable integrated circuit system having an encapsulation with a cavity, a passive device, and a first interposer therein, the first interposer exposed by the cavity, the cavity having a cavity width;

mounting a second interposer over the first interposer and the encapsulation, the second interposer having a side facing the cavity and an opposite side having an electrical attachment area directly over the cavity, the second interposer having an interposer width greater than the cavity width;

connecting the second interposer and the first interposer;

mounting an electrical component over the second interposer via electrical connectors, the electrical component completely exposed from the encapsulation, the electrical component having an electrical component width greater than the cavity width, wherein the electrical component and the electrical connectors are capable of being readily detachable from the second interposer for functional testing; and mounting a further passive device directly on the second interposer.

7. The method as claimed in claim 6 wherein mounting the second interposer includes mounting the second interposer having a hole over a sidewall of the cavity.

8. The method as claimed in claim 6 further comprising forming an underfill between the first interposer and the second interposer.

9. The method as claimed in claim 6 further comprising forming an underfill between the electrical component and the second interposer.

10. The method as claimed in claim 6 wherein mounting the second interposer includes mounting the second interposer partially over the encapsulation.

* * * * *